(12) United States Patent
Tsai et al.

(10) Patent No.: US 9,905,690 B1
(45) Date of Patent: Feb. 27, 2018

(54) FIELD EFFECT TRANSISTOR HAVING A MULTI-WIDTH ELECTRODE STRUCTURE AND METHOD FOR MANUFACTURING THE SAME

(71) Applicant: TAIWAN SEMICONDUCTOR CO., LTD., New Taipei (TW)

(72) Inventors: Yi-Lung Tsai, New Taipei (TW); Aryadeep Mrinal, New Taipei (TW); Mohammad Amanullah, New Taipei (TW); Po-Wen Yang, New Taipei (TW); Shu-Siang Liang, New Taipei (TW)

(73) Assignee: TAIWAN SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 15/270,498

(22) Filed: Sep. 20, 2016

(30) Foreign Application Priority Data

Aug. 16, 2016 (TW) .............................. 105126092 A

(51) Int. Cl.
*H01L 29/40* (2006.01)
*H01L 21/306* (2006.01)
(Continued)

(52) U.S. Cl.
CPC .... *H01L 29/7831* (2013.01); *H01L 21/28525* (2013.01); *H01L 21/30604* (2013.01); *H01L 21/31111* (2013.01); *H01L 29/401* (2013.01); *H01L 29/4236* (2013.01); *H01L 29/42376* (2013.01); *H01L 29/4916* (2013.01)

(58) Field of Classification Search
CPC ........... H01L 29/7831; H01L 29/42376; H01L 29/4236; H01L 29/4916; H01L 21/28525; H01L 21/31111; H01L 21/30604; H01L 29/401
See application file for complete search history.

(56) References Cited

U.S. PATENT DOCUMENTS 4,914,058 A * 4/1990 Blanchard ......... H01L 29/42312
148/DIG. 126
6,541,817 B1 * 4/2003 Hurkx ................. H01L 29/0634
257/135

(Continued)

FOREIGN PATENT DOCUMENTS

TW 201140703 A1 11/2011

*Primary Examiner* — Hoang-Quan Ho
(74) *Attorney, Agent, or Firm* — Muncy, Geissler, Olds & Lowe, P.C.

(57) ABSTRACT

A field effect transistor is manufactured by firstly forming an epitaxial layer on a substrate. Then, a trench having an oxide layer is formed on the epitaxial layer. The oxide layer has a first electrode portion having a first width and a first height and a second electrode portion having a second width and a second height. A gate oxide layer covering the oxide layer and the second electrode portion has a gate portion having a third width. The epitaxial layer has a body region and a source region, where these two regions are adjacent to the gate portion and covered by an interlayer dielectric. A source electrode covering the body region and the interlayer dielectric contacts the source region. The first height is no less than the second height, the first width is smaller than the second width, and the second width is smaller than the third width.

8 Claims, 20 Drawing Sheets

(51) Int. Cl.
  *H01L 21/311* (2006.01)
  *H01L 21/285* (2006.01)
  *H01L 29/49* (2006.01)
  *H01L 29/423* (2006.01)
  *H01L 29/78* (2006.01)

(56) References Cited

U.S. PATENT DOCUMENTS

| | | | |
|---|---|---|---|
| 8,841,721 B2 * | 9/2014 | Yen | H01L 29/4236 257/330 |
| 2006/0060916 A1 * | 3/2006 | Girdhar | H01L 29/407 257/330 |
| 2011/0037120 A1 * | 2/2011 | Chen | H01L 29/407 257/331 |
| 2011/0039383 A1 * | 2/2011 | Chen | H01L 29/407 438/270 |
| 2011/0220990 A1 * | 9/2011 | Chang | H01L 29/402 257/330 |
| 2014/0167151 A1 * | 6/2014 | Yen | H01L 29/4236 257/330 |
| 2014/0291758 A1 * | 10/2014 | Lee | H01L 29/41766 257/331 |
| 2016/0351668 A1 * | 12/2016 | Schwetlick | H01L 29/42368 |

\* cited by examiner

FIELD EFFECT TRANSISTOR HAVING A MULTI-WIDTH ELECTRODE STRUCTURE AND METHOD FOR MANUFACTURING THE SAME

This application claims the benefit of Taiwan Patent Application Serial No. 105126092, filed Aug. 16, 2016, the subject matter of which is incorporated herein by reference.

BACKGROUND OF INVENTION

1. Field of the Invention

The invention relates to a field effect transistor and a method for manufacturing this field effect transistor, and more particularly to the field effect transistor and the method for manufacturing the field effect transistor that include at least one electrode portion having a multi-width structure.

2. Description of the Prior Art

With blooming growths in modern technology, one of the progresses in the semiconductor manufacturing technique is the development of the metal-oxide-semiconductor field effect transistor (MOSFET).

Currently, various manufacturing processes have been developed to produce the MOSFET. Generally speaking, the production of the MOSFET is firstly to form an epitaxial layer on a semiconductor substrate, then to form trenches on the epitaxial layer, and finally to form a gate of the transistor by various steps in the corresponding trenches.

However, in almost all these existing gate processes to produce the MOSFET, shortcomings of a high total gate charge (Qg) and a high practical figure of merit (FOM) are usually seen. In the art, the total gate charge stands for electric charges required for the gate when the MOSFET is in a fully conductive state. The total gate charge is related to the cut-in speed of the MOSFET. A higher total gate charge would reduce the switch speed, but will increase the gate loss, from which the switching loss would be raised but the performance will be reduced, respectively. The practical FOM is determined by the on-resistance and the total gate charge (Qg×Rdson). A higher practical FOM tells that the conduction loss and the switch loss are worse.

Hence, to the art of producing the MOSFET and forming the trench, the topics how to reduce the total gate charge and the practical FOM are definitely crucial.

SUMMARY OF THE INVENTION

In view of the existing manufacturing processes for the MOSFETs, common shortcomings of high total gate charge and practical figure of merit are yet to be resolved. Accordingly, it is the primary object of the present invention to provide a field effect transistor having a multi-width electrode structure and the method for manufacturing the same, that improve the electrode structure to present multiple widths and different heights, and so that the total gate charge and the practical figure of merit can be substantially reduced.

In the present invention, the method for manufacturing a field effect transistor having a multi-width electrode structure includes: a step (a) of providing a semiconductor substrate and forming an epitaxial layer thereon; a step (b) of etching the epitaxial layer to form a trench extending in a vertical direction, the trench having at least one sidewall and a bottom; a step (c) of forming an oxide layer over a surface of the epitaxial layer, said at least one sidewall and the bottom of the trench and forming a first polysilicon layer on the oxide layer; a step (d) of etching part of the first polysilicon layer and having the rest of the first polysilicon layer to form a first electrode polysilicon layer in the trench; a step (e) of etching part of the oxide layer neighboring to a top of the first electrode polysilicon layer and said at least one sidewall of the trench so as to form a first gradually-concave structure at the oxide layer neighboring to the first electrode polysilicon layer, the first gradually-concave structure being concave gradually from an outer edge to the first electrode polysilicon layer; as step (f) of forming a second polysilicon layer on the first electrode polysilicon layer, and the second polysilicon layer filling the first gradually-concave structure; a step (g) of etching part of the second polysilicon layer, having the rest of the second polysilicon layer to form a second electrode polysilicon layer in the trench, and having the first electrode polysilicon layer and the second electrode polysilicon layer to form a first electrode portion, a width-varying portion and a second electrode portion, the width-varying portion being located at the first gradually-concave structure, the first electrode portion being extended from the width-varying portion to the bottom of the trench, the second electrode portion being extended from the width-varying portion in a direction away from the bottom, the first electrode portion having a first height in the vertical direction and a first width in a horizontal direction perpendicular to the vertical direction, the second electrode portion having a second height in the vertical direction and a second width in the horizontal direction; a step (h) of etching the oxide layer neighboring to a top of the second electrode portion and said at least one sidewall of the trench; a step (i) of forming a gate oxide layer on the second electrode portion and at least one sidewall of the trench, and further forming a gate portion on the gate oxide layer, the gate portion being spaced to the second electrode portion via the gate oxide layer and having a third width in the horizontal direction; a step (j) of forming a body region and a source region orderly on part of the epitaxial layer neighboring to the gate portion; a step (k) of forming an interlayer dielectric covering the source region and the gate portion; and a final step (l) of forming a source electrode covering the body region and the interlayer dielectric and connecting the source region so as to produce the field effect transistor having a multi-width electrode structure. In the present invention, the first height is larger than or equal to the second height, the first width is smaller than the second width, and the second width is smaller than the third width.

In one embodiment of the present invention, between the step (b) and the step (c), the method further includes a step (b0) of forming an expendable sacrificial oxide layer over the surface of the epitaxial layer, said at least one sidewall and the bottom of the trench, and a step (b1) of completely etching the expendable sacrificial oxide layer. Also, the step (h) further includes a step (h0) of having part of the oxide layer neighboring to the second electrode portion to include a second gradually-concave structure gradually concave from an outer edge thereof toward the second electrode portion, in which the gate oxide layer fills the second gradually-concave structure. In addition, the step (i) further includes a step (i0) of forming a third polysilicon layer on the gate oxide layer and etching part of the third polysilicon layer so as to have the rest of the third polysilicon layer to form the gate portion in the trench.

In the present invention, the field effect transistor having a multi-width electrode structure includes a semiconductor substrate, an epitaxial layer, an oxide layer, a first electrode portion, a width-varying portion, a second electrode portion, a gate oxide layer, a gate portion, a body region, a source region, an interlayer dielectric and a source electrode. The epitaxial layer is formed on the semiconductor substrate, and extends in a vertical direction to have at least one trench, in which the trench has at least one sidewall and a bottom. The oxide layer is formed over said at least one sidewall and the bottom of the trench, and has a first gradually-concave structure gradually concave from an outer edge thereof toward a center of the trench. The first electrode portion, neighboring to the bottom and spaced to the epitaxial layer via the oxide layer, has a first height in the vertical direction and a first width in a horizontal direction perpendicular to the vertical direction. The width-varying portion filling the first gradually-concave structure is extended from the first electrode portion in a direction away from the bottom of the trench, and spaced to the epitaxial layer via the oxide layer. The second electrode portion, extending inside the trench from the width-varying portion in a direction away from the bottom of the trench and spaced to the epitaxial layer via the oxide layer, has a second height in the vertical direction and a second width in the horizontal direction. The gate oxide layer is formed over said at least one sidewall, the oxide layer and the second electrode portion inside the trench. The gate portion, formed on the gate oxide layer and spaced to the second electrode portion via the gate oxide layer, has a third width in the horizontal direction. The body region is located on the epitaxial layer by neighboring to the gate portion and spacing the gate portion via the gate oxide layer. The source region is located on the body region by spacing the gate portion via the gate oxide layer. The interlayer dielectric is to cover the source region and the gate portion. The source electrode is to cover the body region and the interlayer dielectric, and connects the source region. In the present invention, the first height is larger than or equal to the second height, the first width is smaller than the second width, and the second width is smaller than the third width.

In one embodiment of the present invention, the oxide layer neighboring to the second electrode portion has a second gradually-concave structure gradually concave from an outer edge thereof toward the second electrode portion, and the gate oxide layer fills the second gradually-concave structure.

By providing the field effect transistor having a multi-width electrode structure and the method for manufacturing the same in accordance with the present invention, since the electrode structure presents multiple widths and different heights (the first width of the first electrode portion is smaller than the second width of the second electrode portion, the second width of the second electrode portion is further smaller than the third width of the gate portion, and the second height of the second electrode portion is smaller than or equal to the first height of the height of the first electrode portion), then the total gate charge and the practical figure of merit can be effectively reduced.

All these objects are achieved by the field effect transistor having a multi-width structure and the method for manufacturing the same described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a field effect transistor having a multi-width structure and a method for manufacturing the same. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
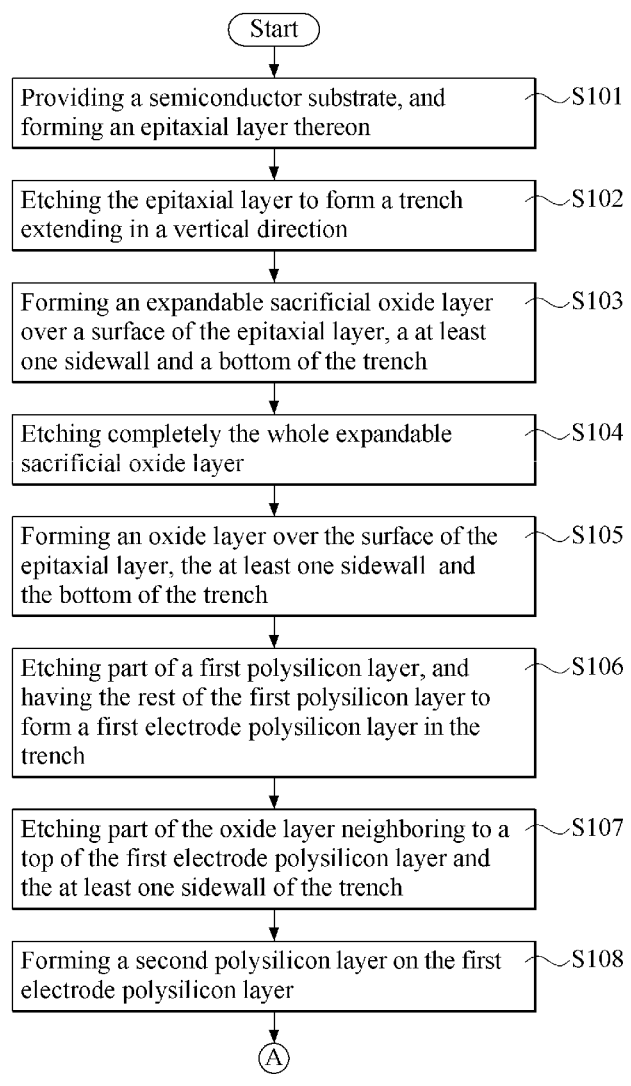
FIG. 1 and FIG. 1A are continuous to show a flowchart of a preferred embodiment of the method for manufacturing a field effect transistor having a multi-width electrode structure in accordance with the present invention.
Figure 1A:
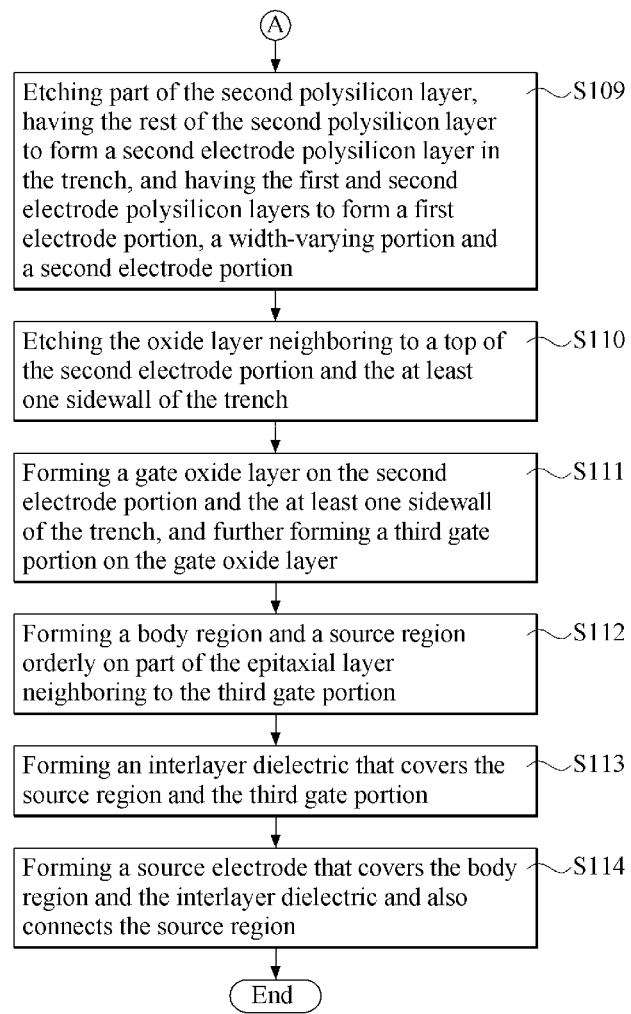
Figure 2:
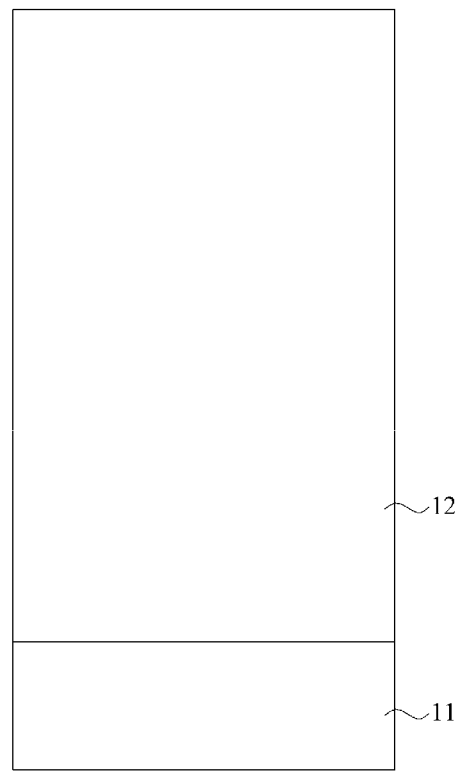
FIG. 2 is a schematic cross-sectional view of the semiconductor substrate and the epitaxial layer in the preferred embodiment of FIG. 1 and FIG. 1A.
Figure 3:
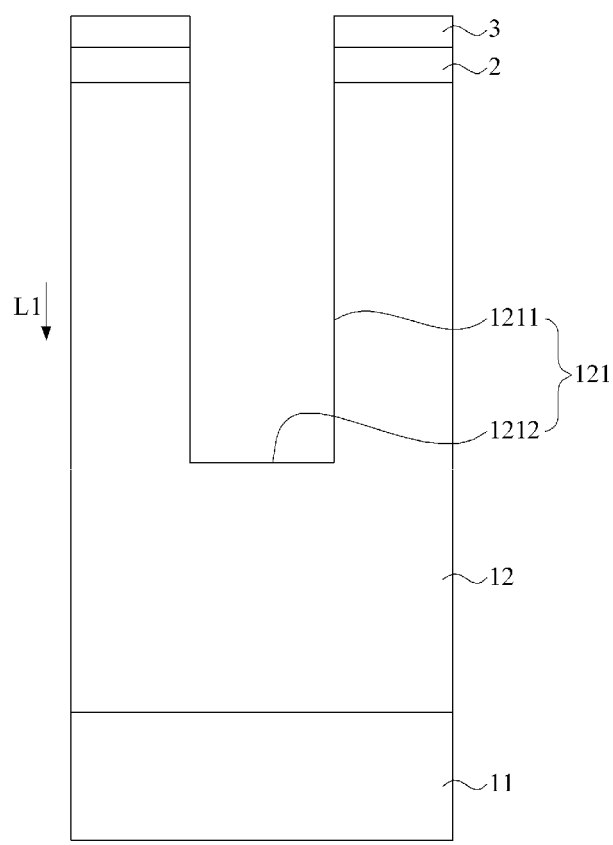
FIG. 3 is a schematic cross-sectional view of the trench etched from the epitaxial layer of FIG. 2.
Figure 4:
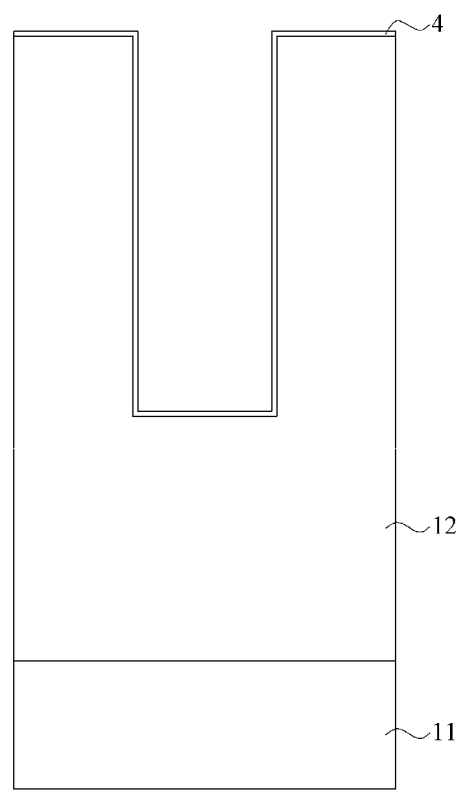
FIG. 4 is a schematic cross-sectional view of the expendable sacrificial oxide layer formed over the trench of FIG. 3.
Figure 5:
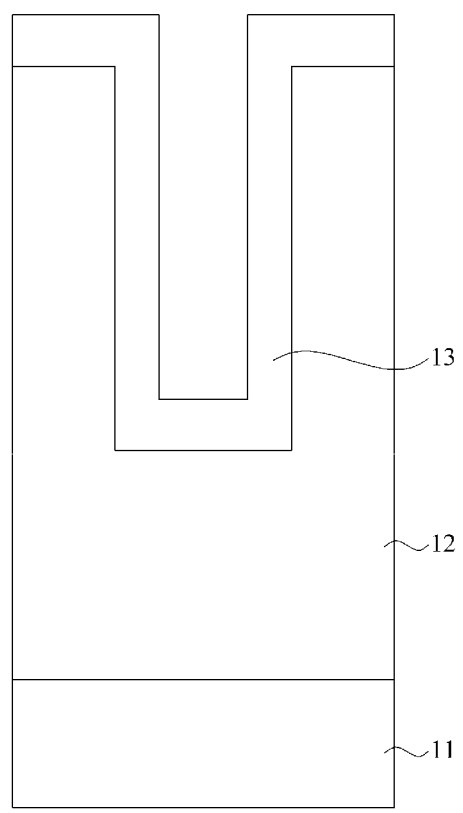
FIG. 5 is a schematic cross-sectional view of the oxide layer formed over the trench of FIG. 4.
Figure 6:
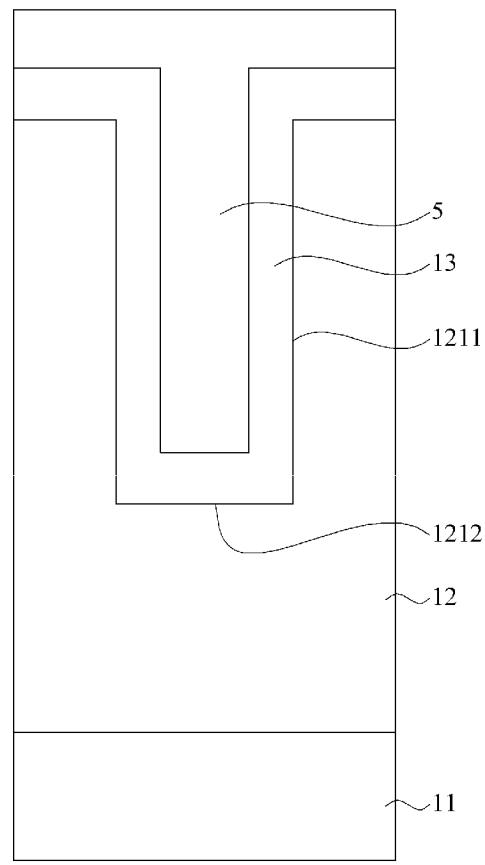
FIG. 6 is a schematic cross-sectional view of the first polysilicon layer formed over the oxide layer of FIG. 5.
Figure 7:
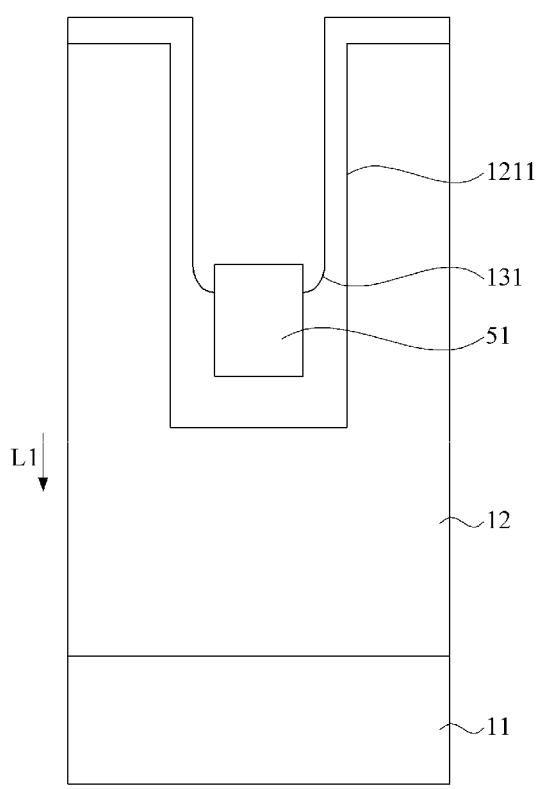
FIG. 7 is a schematic cross-sectional view of the first electrode polysilicon layer formed by etching the first polysilicon layer of FIG. 6.
Figure 8:
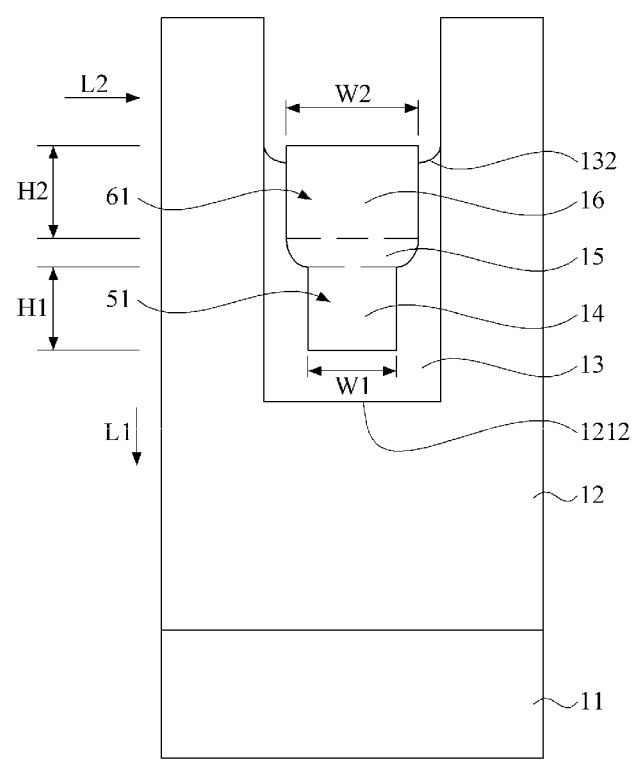
FIG. 8 is a schematic cross-sectional view of the second electrode polysilicon layer formed by etching the second polysilicon layer in the preferred embodiment of FIG. 1 and FIG. 1A.
Figure 9:
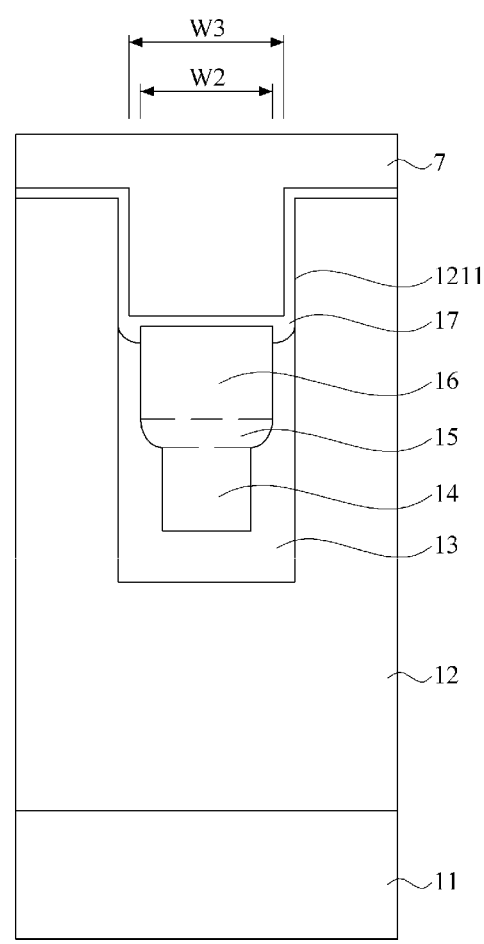
FIG. 9 is a schematic cross-sectional view of the gate oxide layer formed over the third polysilicon layer in the preferred embodiment of FIG. 1 and FIG. 1A.
Figure 10:
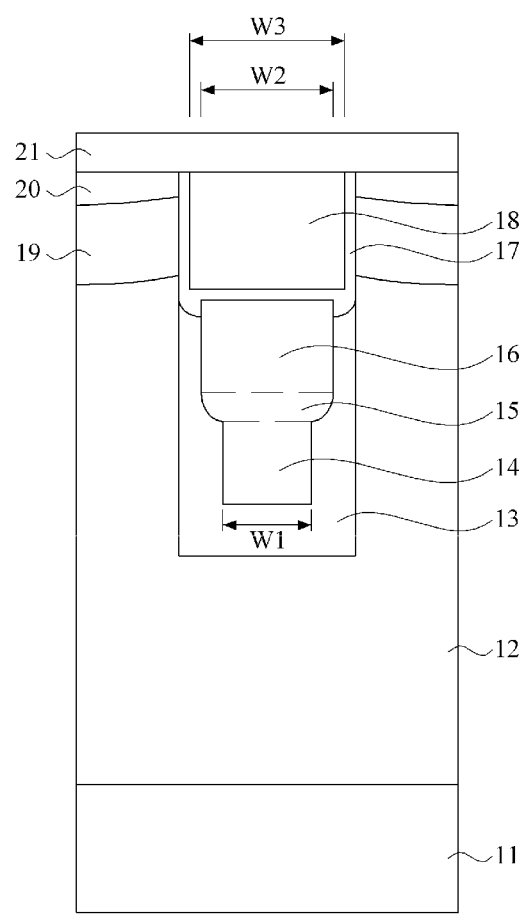
FIG. 10 is a schematic cross-sectional view of the interlayer dielectric in the preferred embodiment of FIG. 1 and FIG. 1A.
Figure 11:
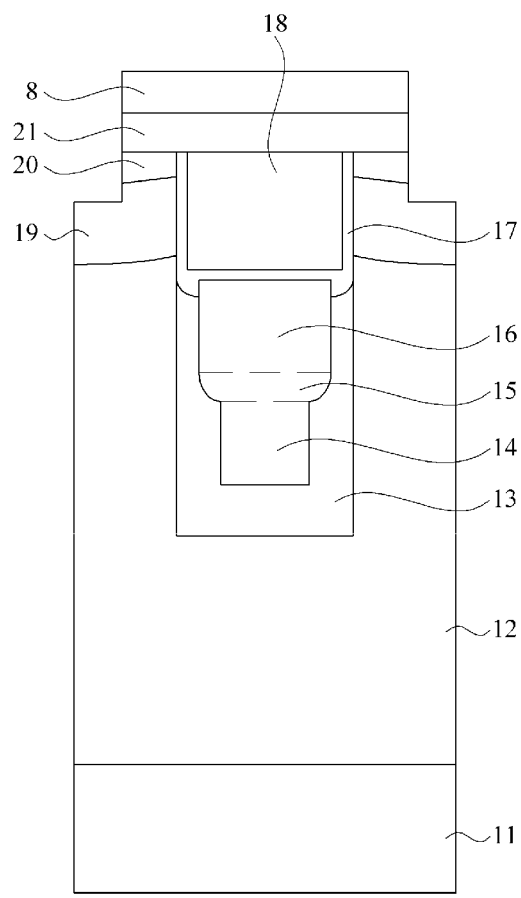
FIG. 11 is schematic cross-sectional view of the etched mask layer and the etched body region and source region in the preferred embodiment of FIG. 1 and FIG. 1A.
Figure 12:
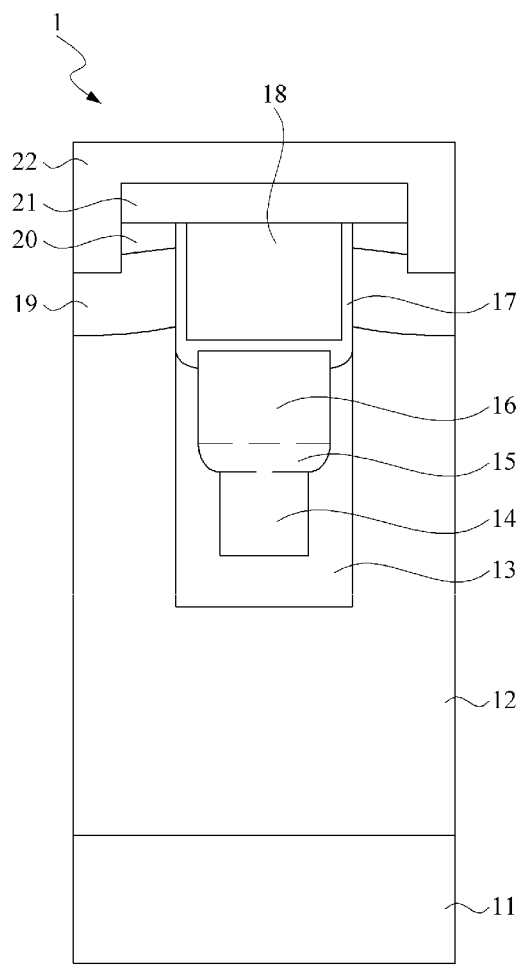
FIG. 12 is schematic cross-sectional view of an embodiment of the field effect transistor having a multi-width electrode structure manufactured by the preferred embodiment of FIG. 1 and FIG. 1A.

Refer now from FIG. 1 to FIG. 12; where FIG. 1 and FIG. 1A are continuous to show a flowchart of a preferred embodiment of the method for manufacturing a field effect transistor having a multi-width electrode structure in accordance with the present invention, FIG. 2 is a schematic cross-sectional view of the semiconductor substrate and the epitaxial layer in the preferred embodiment of FIG. 1 and FIG. 1A, FIG. 3 is a schematic cross-sectional view of the trench etched from the epitaxial layer of FIG. 2, FIG. 4 is a schematic cross-sectional view of the expendable sacrificial oxide layer formed over the trench of FIG. 3, FIG. 5 is a schematic cross-sectional view of the oxide layer formed over the trench of FIG. 4, FIG. 6 is a schematic cross-sectional view of the first polysilicon layer formed over the oxide layer of FIG. 5, FIG. 7 is a schematic cross-sectional view of the first electrode polysilicon layer formed by etching the first polysilicon layer of FIG. 6, FIG. 8 is a schematic cross-sectional view of the second electrode polysilicon layer formed by etching the second polysilicon layer in the preferred embodiment of FIG. 1 and FIG. 1A, FIG. 9 is a schematic cross-sectional view of the gate oxide layer formed over the third polysilicon layer in the preferred embodiment of FIG. 1 and FIG. 1A, FIG. 10 is a schematic cross-sectional view of the interlayer dielectric in the preferred embodiment of FIG. 1 and FIG. 1A, FIG. 11 is schematic cross-sectional view of the etched mask layer and the etched body region and source region in the preferred embodiment of FIG. 1 and FIG. 1A, and FIG. 12 is schematic cross-sectional view of an embodiment of the field effect transistor having a multi-width electrode structure manufactured by the preferred embodiment of FIG. 1 and FIG. 1A.

As shown in FIG. 1 and FIG. 2, in the flowchart of the preferred method for manufacturing a field effect transistor having a multi-width electrode structure, Step S101 is firstly performed to provide a semiconductor substrate 11, and to form an epitaxial layer 12 on the semiconductor substrate 11. For the process for the aforesaid step can simply adopt a current art, thus details thereabout would be omitted herein. In the present invention, the semiconductor substrate 11 is generally doped with an ion concentration (N-type for example), the epitaxial layer 12 is generally doped with another ion concentration (N-type for example), and the ion concentration for the epitaxial layer 12 is usually lower than that for the semiconductor substrate 11. Anyhow, all those are matured in the art, and thus details thereabout would be omitted herein.

After Step S101 is performed, in Step S102, the epitaxial layer 12 is etched to have at least one trench 121 (one shown in the figure) extending in a vertical direction L1, in which the trench 121 has at least one sidewall 1211 and a bottom 1212. As shown in FIG. 3, while in etching the epitaxial layer 12, a hard mask 2 (details for the material is omitted herein) is firstly formed on the epitaxial layer 12. Then, a photoresist layer 3 (a prior art as well) is formed on the hard mask 2, and further the trench 121 is formed by etching (a prior art).

As shown in FIG. 4, Step S103 is performed to form an expandable sacrificial oxide layer 4 over a surface of the epitaxial layer 12, at least one sidewall 1211 and a bottom 1212 of the trench 121. Then, in Step S104, the whole expandable sacrificial oxide layer 4 is completely etched. In the present invention, Step S103 and Step S104 are introduced to improve the regularity of the lattice arrangement of the crystals on the surface of the epitaxial layer 12, said at least one sidewall 1211 and the bottom 1212 of the trench 121, so as to enhance the smoothness thereon. In other embodiments, Step S103 and Step S104 may be optional steps.

As shown in FIG. 5 and FIG. 6, in Step S105, an oxide layer 13 is formed over the surface of the epitaxial layer 12, said at least one sidewall 1211 and the bottom 1212 of the trench 121, and further a first polysilicon layer 5, resembled to a T-shape structure, is formed on the oxide layer 13.

As shown in FIG. 7, in Step S106, part of a first polysilicon layer 5 is etched so as to have the rest of the first polysilicon layer 5 to form a first electrode polysilicon layer 51 in the trench 121. Then, in Step S107, part of the oxide layer 13 neighboring to a top of the first electrode polysilicon layer 51 and said at least one sidewall 1211 of the trench 121 is etched to form a first gradually-concave structure 131 at the oxide layer 13 that neighbors to the first electrode polysilicon layer 51, in which the first gradually-concave structure 131 is concave from an outer edge to the first electrode polysilicon layer 51 (or toward a center of the trench 121). In practice, the width of the first gradually-concave structure 131 is gradually decreased, in a vertical direction L1, from an upper portion thereof to the central portion neighboring the first electrode polysilicon layer 51. In addition, in this embodiment, the first gradually-concave structure 131 can be seen as a symmetric structure extending to both sides from an upper portion of the first electrode polysilicon layer 51. The thickness of the oxide layer 13 neighboring said at least one sidewall 1211 of the trench 121 and the surface of the epitaxial layer 12 is thinner, while the thickness of the oxide layer 13 neighboring the bottom 1212 of the trench 121 is thicker.

As shown in FIG. 8, in Step S108, a second polysilicon layer (not shown in the figure) is formed on the first electrode polysilicon layer 51. The second polysilicon layer can be embodied by resembling to the T-shape structure of the first polysilicon layer 5, and are to fill the first gradually-concave structure 131.

Then, in Step S109, part of the second polysilicon layer is etched so as to have the rest of the second polysilicon layer to form a second electrode polysilicon layer 61 in the trench 121, and further the first and second electrode polysilicon layers 51, 61 are used to form a first electrode portion 14, a width-varying portion 15 and a second electrode portion 16.

In the present invention, the width-varying portion 15 is located at the first gradually-concave structure 131, and spaced to the epitaxial layer 12 via the oxide layer 13. The first electrode portion 14 is extended from the width-varying portion 15 to the trench bottom 1212, and also spaced to the epitaxial layer 12 via the oxide layer 13. The second electrode portion 16 is extended from the width-varying portion in a direction away from the trench bottom 1212, and spaced to the epitaxial layer 12 via the oxide layer 13, as well.

The first electrode portion 14 has a first height H1 in the vertical direction L1 and a first width W1 in another horizontal direction L2 perpendicular to the vertical direction L1. The second electrode portion 16 has a second height H2 in the vertical direction L1 and a second width W2 in another horizontal direction L2. In particular, the first height H1 is larger than or equal to the second height H2, and the first width W1 is smaller than the second width W2.

As shown in FIG. 8, in Step S110, the oxide layer 13 neighboring to a top of the second electrode portion 16 and said at least one sidewall 1211 of the trench 121 is etched to expose the surface of the epitaxial layer 12 and said at least one sidewall 1211 of the trench 121, and also to form a second gradually-concave structure 132 at the oxide layer 13 neighboring to the second electrode portion 16. The second gradually-concave structure 132 is gradually concave from an outer edge downward to the second electrode portion 16.

Similarly, the width of the second gradually-concave structure 132 is gradually decreased in a downward vertical direction L1. In the preferred embodiment of the present invention, the second gradually-concave structure 132 is formed by closing to the upper portion of the second electrode portion 16. In addition, the first electrode portion 14 and the second electrode portion 16 can be, but not limited to, source electrode portions or gate electrode portions.

As shown in FIG. 9 and FIG. 10, in Step S111, a gate oxide layer 17 is formed on the second electrode portion 16 and said at least one sidewall 1211 of the trench 121. The gate oxide layer 17 is to fill the second gradually-concave structure 132. In addition, in Step S111, a third polysilicon layer 7 is formed on the gate oxide layer 17, and part of the third polysilicon layer 7 is etched so as to have the rest of the third polysilicon layer 7 to form a gate portion 18 inside the trench 121, such that a gate portion 18 can be formed on the gate oxide layer 17.

In addition, the gate portion 18 is spaced to the second electrode portion 16 via the gate oxide layer 17. The gate portion 18 has a width of W3 in the horizontal direction L2, and the third width W3 is larger than the second width W2.

As shown in FIG. 10, in Step S112, a body region 19 (P-body) and a source region 20(N+) are orderly formed on part of the epitaxial layer 12 neighboring to the third gate portion 18. In the present invention, the body region 19 is spaced to the gate portion 18 via the gate oxide layer 17, and the source region 20 is spaced to the gate portion 18 via the gate oxide layer 17.

As shown in FIG. 10 and FIG. 11, in Step S113, an interlayer dielectric (ILD) 21 is formed to cover the source region 20 and the gate portion 18. Then, a mask layer 8 is formed on the interlayer dielectric 21. Further, after part of the body region 19 and the source region 20 are etched, the mask layer 8 is removed.

As shown in FIG. 12, in Step S114, a source electrode 22 is formed by covering the body region 19 and the interlayer dielectric 21. The source electrode 22 is also connected with the source region 20. Thereupon, a field effect transistor having a multi-width electrode structure 1 is produced by performing all the aforesaid steps of the preferred method of the present invention. In particular, the source electrode 22 of the present invention is embodied as an n-shape structure.

Figure 13:
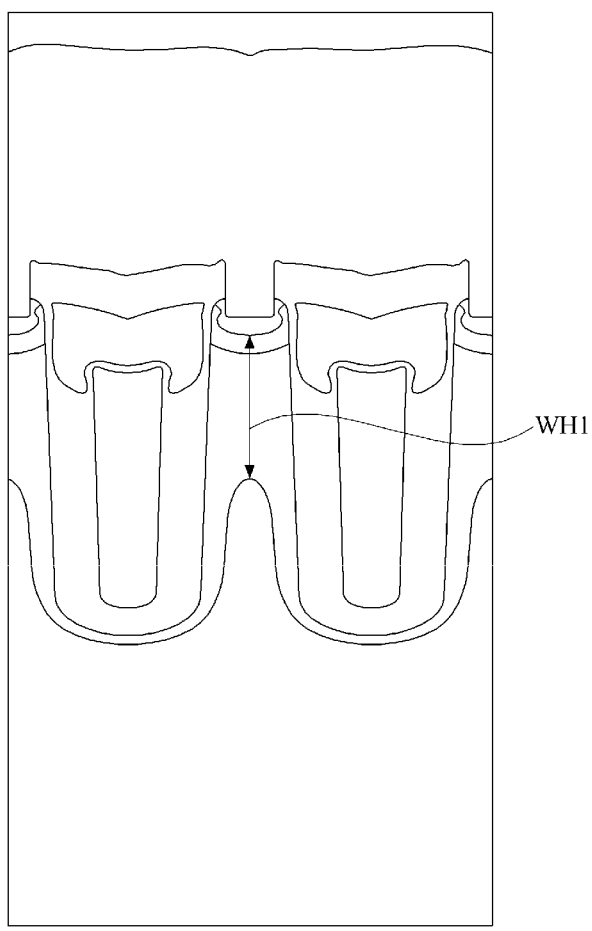
FIG. 13 is a schematic cross-sectional view of a conventional field effect transistor in the prior art.
Figure 14:
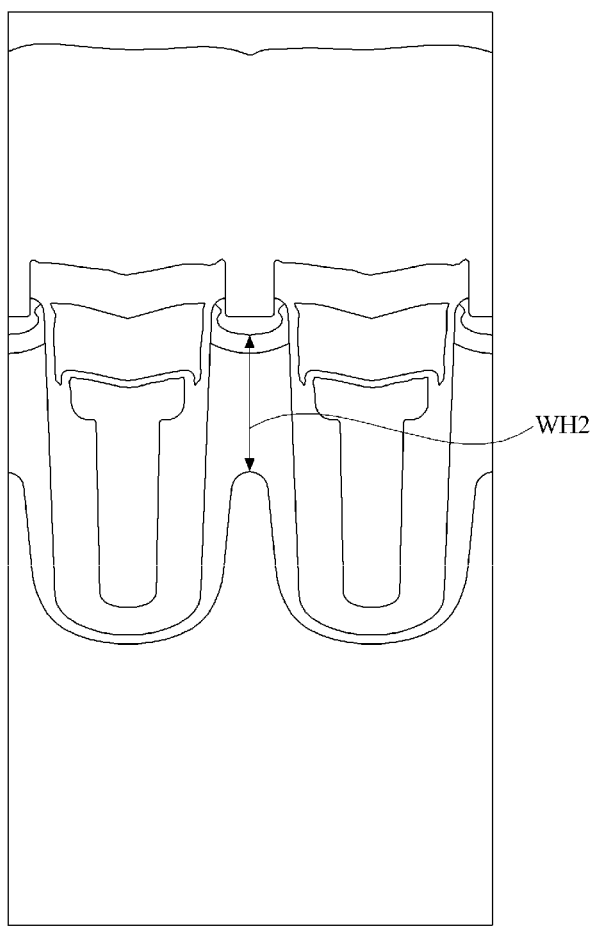
FIG. 14 is a schematic cross-sectional view of a the first embodiment of the field effect transistor having a multi-width electrode structure in accordance with the present invention.
Figure 15:
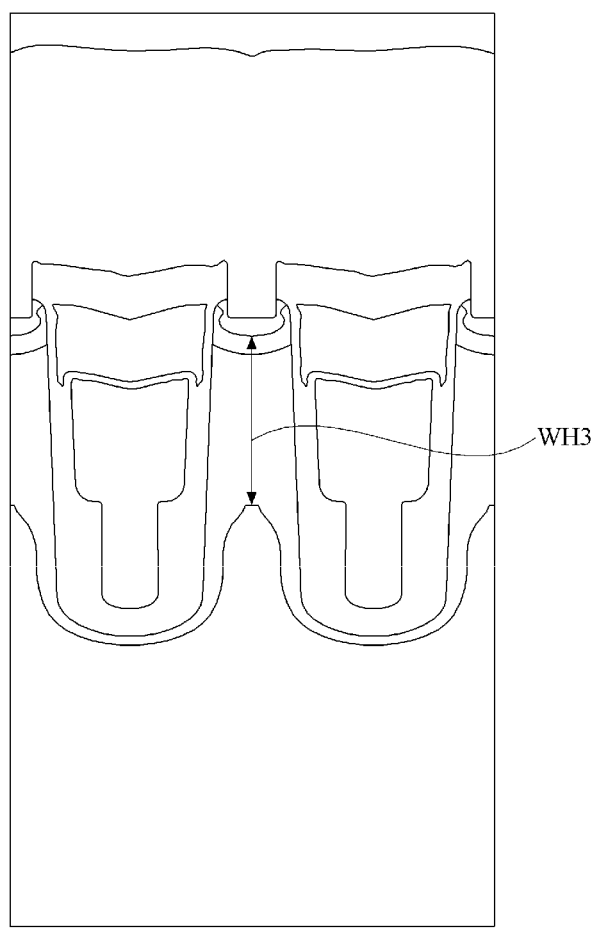
FIG. 15 is a schematic cross-sectional view of a further embodiment of the field effect transistor having a multi-width electrode structure in accordance with the present invention.

Refer also to FIG. 13 through FIG. 15; where FIG. 13 is a schematic cross-sectional view of a conventional field effect transistor in the prior art, FIG. 14 is a schematic cross-sectional view of the first embodiment of the field effect transistor having a multi-width electrode structure in accordance with the present invention, and FIG. 15 is a schematic cross-sectional view of a further embodiment of the field effect transistor having a multi-width electrode structure in accordance with the present invention.

As shown, after relevant software in the art is applied to perform an AC simulation upon each of the field effect transistors of FIGS. 13-15, the simulation results are listed in the following Table.

|  | Breakdown voltage (V) | Threshold voltage (V) | On-resistance (mΩ-mm$^2$) | Practical FOM |
|---|---|---|---|---|
| FIG. 13 | ≈125 | 3 | 50.39 | 5946 |
| FIG. 14 | ≈125 | 3 | 51.59 | 5572 |
| FIG. 15 | ≈120 | 3 | 51.82 | 5545 |

As shown in the table, the practical FOM and the total gate charge for each structure of FIG. 14 and FIG. 15 (embodiments of the present invention) are superior to those of the structure of FIG. 13 (prior art). Thus, it is obvious that, by applying the field effect transistors of the present invention, the total gate charge and the practical FOM can be substantially reduced.

In addition, as shown, the depletion width WH1 is about equal to the depletion width WH2, and the depletion width WH3 is larger than the depletion width WH2. Hence, if the ratio of the second height H2 to the first height H1 is larger, then the width of the depletion region would be larger as well. Thus, with the same drain bias ($V_D$), the depletion capacitance ($C_{dep}$) in the embodiments of the present invention would be smaller than that in the art. The aforesaid depletion widths WH1, WH2 and WH3 stand for corresponding lengths in the vertical direction L1 labeled by WH1, WH2 and WH3 in the figures, respectively.

It shall be noted that the capacitance $C_{gd}$ is generally affected by the aforesaid depletion capacitance $C_{dep}$ and the oxide layer capacitance $C_{OX}$. Also, the input capacitance ($C_{ISS}$) is a summation of the capacitance $C_{gs}$ and the capacitance $C_{gd}$, the output capacitance ($C_{OSS}$) is a summation of the capacitance $C_{ds}$ and the capacitance $C_{gd}$, and the reverse transformation capacitance ($C_{RSS}$) is equal to the capacitance $C_{gd}$.

Figure 16:
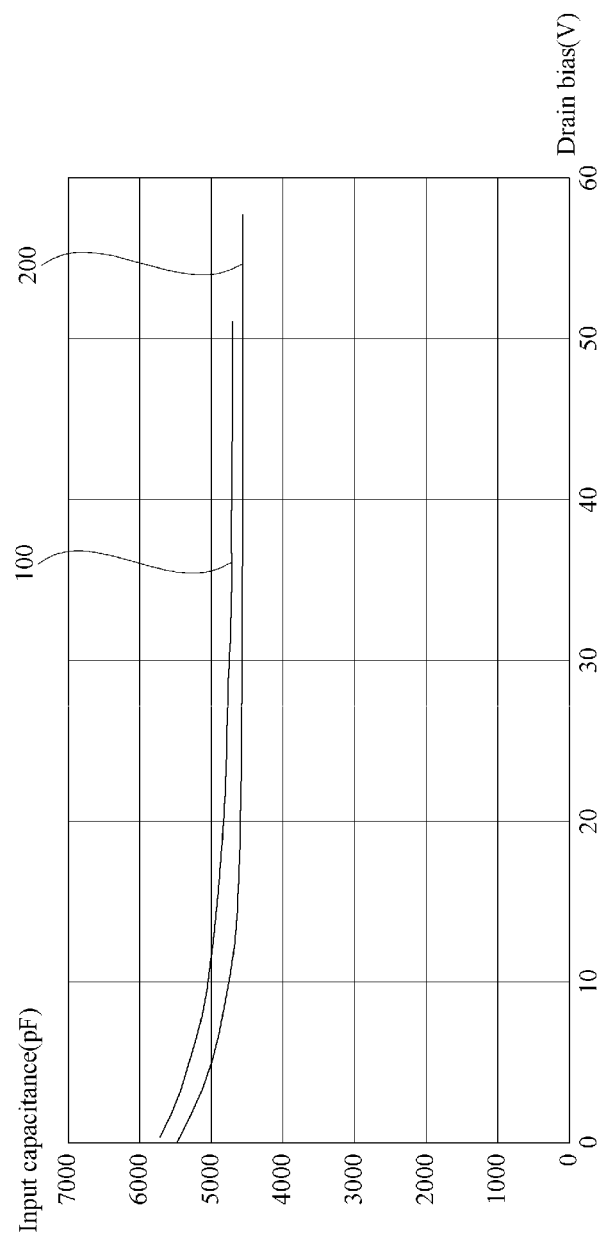
FIG. 16 is a plot of waveforms of the input capacitance according to the present invention and the prior art.

Referring now to FIG. 16, is a plot of waveforms of the input capacitance ($C_{ISS}$) according to the present invention and the prior art is shown. As shown, FIG. 16 is produced by performing the AC simulations upon the structures of FIGS. 13-15, in which the waveform 100 stands for the waveform of the structure of FIG. 13, and the waveform 200 stands for the waveform of the structure of FIG. 14 or FIG. 15 (for only a slight difference exists practically between these two structures). From the waveforms 100 and 200, it is noted that, by having the drain bias $V_D$=50V, the input capacitance of the structure of the present invention is remarkably smaller than that of the prior art.

| $V_D$ = 50 V | Input capacitance (pF) | Comparative percentage |
|---|---|---|
| Structure of FIG. 13 | 4701 | N/A |
| Structure of FIG. 14 | 4537 | −3.48% |
| Structure of FIG. 15 | 4579 | −2.59% |

Figure 17:
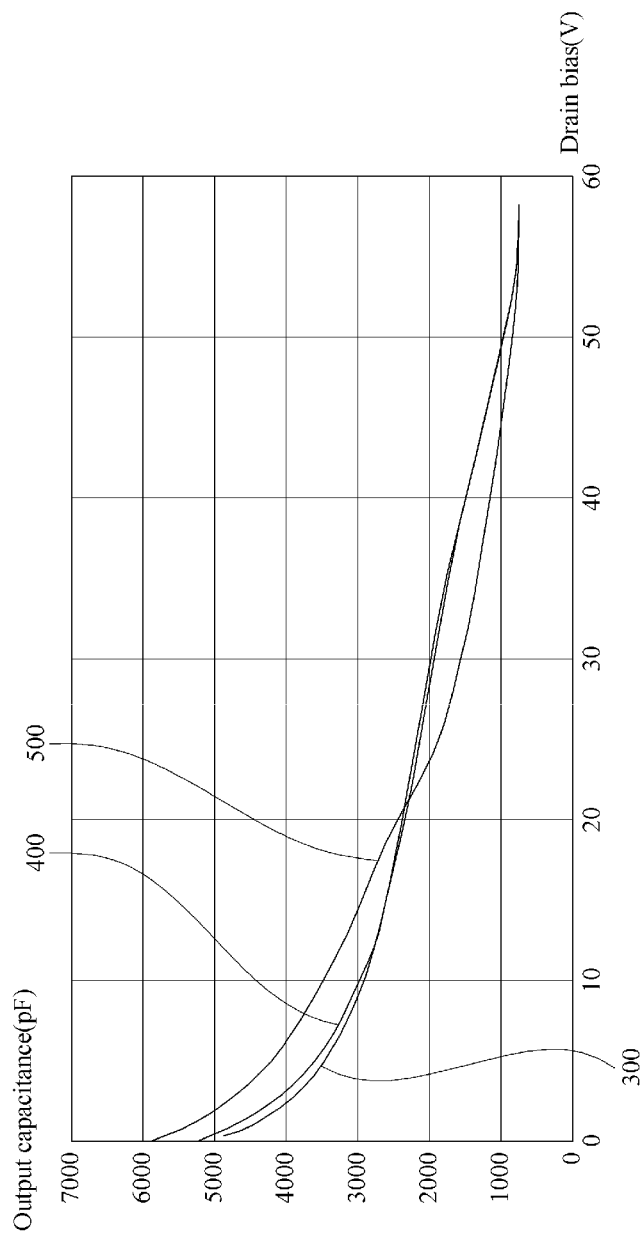
FIG. 17 is a plot of waveforms of the output capacitance according to the present invention and the prior art.

Referring now to FIG. 17, a plot of waveforms of the output capacitance ($C_{OSS}$) according to the present invention and the prior art. As shown, FIG. 17 is produced by performing the AC simulations upon the structures of FIGS. 13-15, in which the waveform 300 stands for the waveform of the structure of FIG. 13, the waveform 400 stands for the waveform of the structure of FIG. 14, and the waveform 500 stands for the waveform of the structure of FIG. 15. From the waveforms 300, 400 and 500, it is noted that, by having the drain bias $V_D$=50V, the output capacitance of the structure of the present invention is remarkably smaller than that of the prior art. In particular, in the case that the first height H1 is equal to the second height H2, the reduction in the output capacitance is significant.

| $V_D = 50$ V | Output capacitance (pF) | Comparative percentage |
|---|---|---|
| Structure of FIG. 13 | 17.2 | N/A |
| Structure of FIG. 14 | 10.7 | −37.51% |
| Structure of FIG. 15 | 4.6 | −73.36% |

Figure 18:
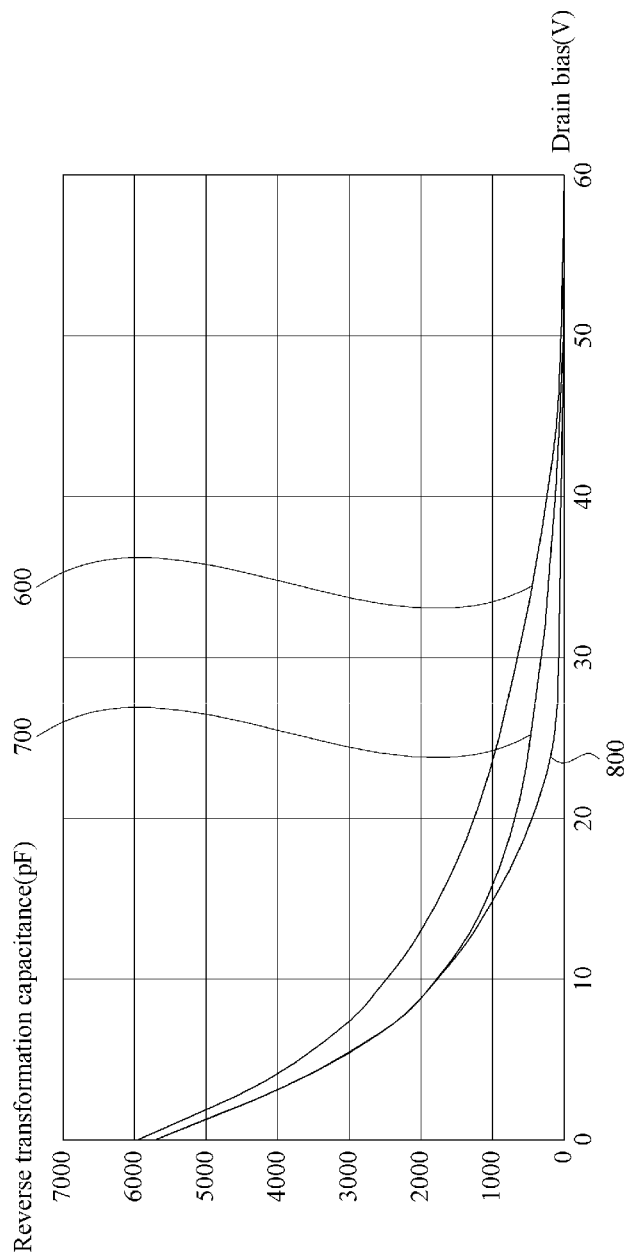
FIG. 18 is a plot of waveforms of the reverse transformation capacitance according to the present invention and the prior art.

Referring now to FIG. 18, a plot of waveforms of the reverse transformation capacitance ($C_{RSS}$) according to the present invention and the prior art is shown. As shown, FIG. 18 is produced by performing the AC simulations upon the structures of FIGS. 13-15, in which the waveform 600 stands for the waveform of the structure of FIG. 13, the waveform 700 stands for the waveform of the structure of FIG. 14, and the waveform 800 stands for the waveform of the structure of FIG. 15. From the waveforms 600, 700 and 800, it is noted that, by having the drain bias $V_D$=50V, the reverse transformation capacitance of the structure of the present invention is remarkably smaller than that of the prior art. In particular, in the case that the first height H1 is equal to the second height H2, the reduction in the reverse transformation capacitance is significant.

| $V_D = 50$ V | Reverse transformation capacitance (pF) | Comparative percentage |
|---|---|---|
| Structure of FIG. 13 | 824 | N/A |
| Structure of FIG. 14 | 820 | −0.49% |
| Structure of FIG. 15 | 717 | −12.99% |

Figure 19:
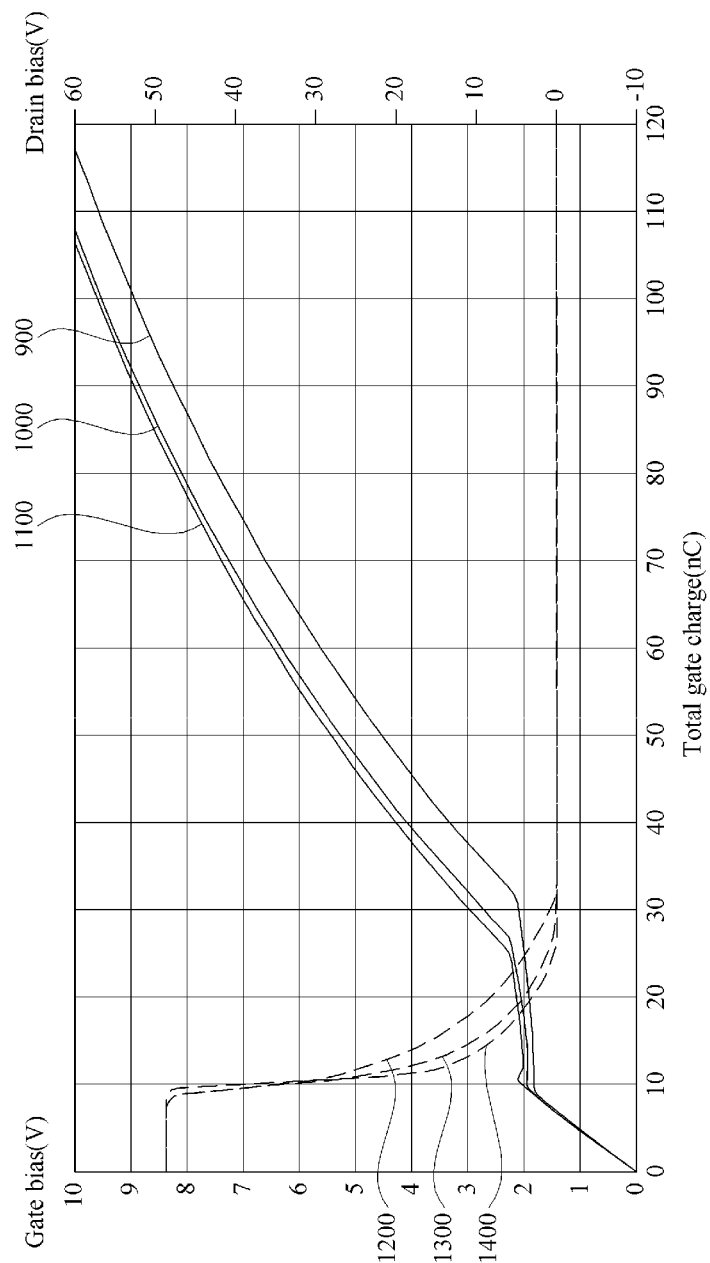
FIG. 19 is a plot of waveforms of the total gate charge according to the present invention and the prior art.

Referring now to FIG. 19, a plot of waveforms of the total gate charge according to the present invention and the prior art is shown. As shown, FIG. 19 is produced by performing the AC simulations upon the structures of FIGS. 13-15, in which the waveforms 900, 1200 stand for the waveforms of the structure of FIG. 13, the waveforms 1000, 1300 stand for the waveforms of the structure of FIG. 14, and the waveforms 1100, 1400 stand for the waveforms of the structure of FIG. 15. From the waveforms 900, 1000, 1100, 1200, 1300 and 1400, it is noted that, no matter by having the same gate bias $V_G$ or the same drain bias $V_D$, the total gate charge ($Q_g$) of the structure of the present invention is remarkably smaller than that of the prior art. A similar conclusion in the $Q_{gd}$ can also be observed in the following table.

| $V_G = 10$ V | $Q_{gs}$ | Comparative percentage |
|---|---|---|
| Structure of FIG. 13 | 9.1 | N/A |
| Structure of FIG. 14 | 9.8 | 7.69% |
| Structure of FIG. 15 | 10.1 | 10.99% |

| $V_G = 10$ V | $Q_{gd}$ | Comparative percentage |
|---|---|---|
| Structure of FIG. 13 | 22.4 | N/A |
| Structure of FIG. 14 | 17.2 | −23.21% |
| Structure of FIG. 15 | 15.9 | −29.02% |

| $V_G = 10$ V | $Q_g$ | Comparative percentage |
|---|---|---|
| Structure of FIG. 13 | 118 | N/A |
| Structure of FIG. 14 | 108 | −8.47% |
| Structure of FIG. 15 | 107 | −9.32% |

In summary, by providing the field effect transistor having a multi-width electrode structure and the method for manufacturing the same in accordance with the present invention, since the electrode structure presents multiple widths and different heights (the first width of the first electrode portion is smaller than the second width of the second electrode portion, the second width of the second electrode portion is further smaller than the third width of the gate portion, and the second height of the second electrode portion is smaller than or equal to the first height of the height of the first electrode portion), then the total gate charge, the practical figure of merit, the input capacitance, the output capacitance and the reverse transformation capacitance can be effectively reduced, and thus the performance of the field effect transistor can be significantly enhanced.

While the present invention has been particularly shown and described with reference to a preferred embodiment, it will be understood by those skilled in the art that various changes in form and detail may be without departing from the spirit and scope of the present invention.

What is claimed is:

1. A method for manufacturing a field effect transistor having a multi-width electrode structure, comprising the steps of:

(a) providing a semiconductor substrate, and forming an epitaxial layer thereon;

(b) etching the epitaxial layer to form a trench extending in a vertical direction, the trench having at least one sidewall and a bottom;

(c) forming an oxide layer over a surface of the epitaxial layer, the at least one sidewall and the bottom of the trench, and forming a first polysilicon layer on the oxide layer;

(d) etching part of the first polysilicon layer, and having the rest of the first polysilicon layer to form a first electrode polysilicon layer in the trench;

(e) etching part of the oxide layer neighboring to a top of the first electrode polysilicon layer and the at least one sidewall of the trench so as to form a first gradually-concave structure at the oxide layer neighboring to the first electrode polysilicon layer, the first gradually-concave structure being concave gradually from an outer edge to the first electrode polysilicon layer;

(f) forming a second polysilicon layer on the first electrode polysilicon layer, and the second polysilicon layer filling the first gradually-concave structure;

(g) etching part of the second polysilicon layer, having the rest of the second polysilicon layer to form a second electrode polysilicon layer in the trench, and having the first electrode polysilicon layer and the second electrode polysilicon layer to form a first electrode portion, a width-varying portion and a second electrode portion, the width-varying portion being located at the first gradually-concave structure, the first electrode portion being extended from the width-varying portion to the bottom of the trench, the second electrode portion being extended from the width-varying portion in a direction away from the bottom, the first electrode portion having a first height in the vertical direction and a first width in a horizontal direction perpendicular to the vertical direction, the second electrode portion having a second height in the vertical direction and a second width in the horizontal direction, the first height being larger than or equal to the second height;

(h) etching the oxide layer neighboring to a top of the second electrode portion and the at least one sidewall of the trench;

(i) forming a gate oxide layer on the second electrode portion and the at least one sidewall of the trench, and further forming a gate portion on the gate oxide layer, the gate portion being spaced to the second electrode portion via the gate oxide layer and having a third width in the horizontal direction;

(j) forming a body region and a source region orderly on part of the epitaxial layer neighboring to the gate portion;

(k) forming an interlayer dielectric covering the source region and the gate portion; and (l) forming a source electrode covering the body region and the interlayer dielectric and connecting the source region so as to produce the field effect transistor having a multi-width electrode structure;

wherein the first height is larger than or equal to the second height, the first width is smaller than the second width, and the second width is smaller than the third width.

2. The method for manufacturing a field effect transistor having a multi-width electrode structure of claim 1, between the Step (b) and the Step (c), further including a Step (b0) of forming an expendable sacrificial oxide layer over the surface of the epitaxial layer, the at least one sidewall and the bottom of the trench, and a Step (b1) of completely etching the expendable sacrificial oxide layer.

3. The method for manufacturing a field effect transistor having a multi-width electrode structure of claim 1, wherein the Step (h) further includes a Step (h0) of having part of the oxide layer neighboring to the second electrode portion to include a second gradually-concave structure gradually concave from an outer edge thereof toward the second electrode portion.

4. The method for manufacturing a field effect transistor having a multi-width electrode structure of claim 3, wherein the gate oxide layer fills the second gradually-concave structure.

5. The method for manufacturing a field effect transistor having a multi-width electrode structure of claim 1, wherein the Step (i) further includes a Step (i0) of forming a third polysilicon layer on the gate oxide layer and etching part of the third polysilicon layer so as to have the rest of the third polysilicon layer to form the gate portion in the trench.

6. A field effect transistor having a multi-width electrode structure, comprising:

a semiconductor substrate;

an epitaxial layer, formed on the semiconductor substrate, extending in a vertical direction to have at least one trench, the trench having at least one sidewall and a bottom;

an oxide layer, formed over the at least one sidewall and the bottom of the trench, having a first gradually-concave structure gradually concave from an outer edge thereof toward a center of the trench;

a first electrode portion, neighboring to the bottom, spaced to the epitaxial layer via the oxide layer, having a first height in the vertical direction and a first width in a horizontal direction perpendicular to the vertical direction;

a width-varying portion, filling the first gradually-concave structure, extending from the first electrode portion in a direction away from the bottom of the trench, spaced to the epitaxial layer via the oxide layer;

a second electrode portion, extending inside the trench from the width-varying portion in another direction away from the bottom of the trench, spaced to the epitaxial layer via the oxide layer, having a second height in the vertical direction and a second width in the horizontal direction;

a gate oxide layer, formed over the at least one sidewall, the oxide layer and the second electrode portion inside the trench;

a gate portion, formed on the gate oxide layer, spaced to the second electrode portion via the gate oxide layer, having a third width in the horizontal direction;

a body region, located on the epitaxial layer, neighboring to the gate portion, spaced to the gate portion via the gate oxide layer;

a source region, located on the body region, spaced to the gate portion via the gate oxide layer;

an interlayer dielectric, covering the source region and the gate portion; and a source electrode, covering the body region and the interlayer dielectric and connecting the source region;

wherein the first height is larger than or equal to the second height, the first width is smaller than the second width, and the second width is smaller than the third width.

7. The field effect transistor having a multi-width electrode structure of claim 6, wherein the oxide layer neighboring to the second electrode portion has a second gradually-concave structure gradually concave from an outer edge thereof toward the second electrode portion.

8. The field effect transistor having a multi-width electrode structure of claim 7, wherein the gate oxide layer fills the second gradually-concave structure.

* * * * *